United States Patent [19]
Stoll

[11] Patent Number: 5,902,519
[45] Date of Patent: May 11, 1999

[54] PROCESS FOR OXIDIZING IRON-DOPED LITHIUM NIOBATE

[75] Inventor: Harold M. Stoll, Rancho Palos Verdes, Calif.

[73] Assignee: Northrop Grumman Corproation, Los Angeles, Calif.

[21] Appl. No.: 08/819,794

[22] Filed: Mar. 18, 1997

[51] Int. Cl.⁶ ..................................... G02B 1/02
[52] U.S. Cl. .................. 252/584; 117/19; 117/928; 430/1
[58] Field of Search .............. 117/19, 208, 213, 117/217, 900, 932, 84, 928; 252/501.1, 584; 359/7

[56] References Cited

U.S. PATENT DOCUMENTS

| | | | |
|---|---|---|---|
| 3,703,328 | 11/1972 | Glass et al. | 350/3.5 |
| 3,799,642 | 3/1974 | Phillips et al. | 359/7 |
| 3,932,299 | 1/1976 | Phillips | 252/300 |
| 4,052,119 | 10/1977 | Williams et al. | 359/7 |

FOREIGN PATENT DOCUMENTS 197512  12/1975  Japan .

Primary Examiner—Felisa Garrett
Attorney, Agent, or Firm—Terry J. Anderson; Karl J. Hoch Jr.

[57] ABSTRACT

A process for oxidizing iron ions contained within iron-doped lithium niobate. The process comprises the steps of protonating the iron-doped lithium niobate crystal and then placing the same into a pressure chamber where between 10–100 atmospheres of dry, ultra-pure pressurized oxygen are applied. While under pressure, the crystal is heated to approximately 950° C. at a rate not to exceed 50° C. per minute, and preferably at a rate not less than 25° C. per minute. The crystals are then continuously heated at approximately 950° C. for approximately 50 hours and then cooled to 30° C. at a rate not to exceed 50° C. per minute, and preferably at a rate not less than approximately 25° C. per minute. The resulting lithium niobate crystal will thereafter contain iron ions wherein the divalent iron ion ration to the trivalent iron ion ratio is approximately 1:100.

21 Claims, 1 Drawing Sheet

PROCESS FOR OXIDIZING IRON-DOPED LITHIUM NIOBATE

FIELD OF THE INVENTION

The present invention relates to processes for oxidizing iron-doped lithium niobate, and more particularly, to processes for increasing the ratio of trivalent iron to divalent iron contained therein.

BACKGROUND OF THE INVENTION

Lithium niobate crystals are known as electro-optic materials that are useful as holographic recording media which have fairly good sensitivity. This sensitivity, as well as diffraction efficiency, can be greatly improved by doping such crystals with iron, as has been disclosed in U.S. Pat. No. 3,703,328 to Glass et al.

In such applications, it is generally advantageous to maintain a minimum function of iron ions (Fe) in the divalent state ($Fe^{+2}$), in order to achieve an optimal holographic write sensitivity, and a relatively larger function of Fe ions in the trivalent state ($Fe^{+3}$), in order to minimize photoconductivity and, hence, minimize sensitivity to self-erasure effects when large numbers of holograms are time-sequentially stored within a common volume of lithium niobate. By maximizing write sensitivity and minimizing erase sensitivity, more high-efficiency holograms can be stored and greater information densities achieved within a given volume of iron-doped lithium niobate ($Fe:LiNbO_3$).

Problematic with such iron-doped lithium niobate crystals, however, is the difficulty in producing such crystals wherein the iron portions contained therein exist predominantly in the trivalent state. More specifically, significant difficulty arises in oxidizing the divalent iron ions normally contained within such crystals, insofar as conventional oxidizing agents and techniques fail to thoroughly penetrate such crystals and hence oxidize the iron contained therein.

While certain processes are known in the art that are effective in oxidizing substantially all of the divalent iron ions present to trivalent ions, such processes suffer from other drawbacks. Generally, most prior art processes require heating such crystals to extremely high temperatures for prolonged periods of time. Such heating, which is typically carried out at temperatures between 800° C. and 1100° C., can cause the formation of lithium tri-niobate ($LiNi_3O_8$), which, as is known to those skilled in the art, causes light to scatter and thus renders the crystal useless in holographic applications.

Such prolonged heating further is known to cause a portion of the lithium present to diffuse out of the crystal. Such diffusion, which is known to begin to occur at approximately 900° C., causes light-absorbing color centers to form within the crystal. The light-absorbing properties of these centers dramatically limit the ability of such crystals to function properly in holographic applications, especially insofar as such color centers are known in the art to absorb light having a wavelength around 532 nanometers, which, for system reasons, is near-optimal with regard to recording holographic data.

Accordingly, there is a need in the art for an efficient, more thorough process for oxidizing iron-doped lithium niobate wherein the trivalent to divalent iron ion ratio is greatly enhanced. There is also a need in the art for a process for oxidizing iron-doped lithium niobate such that the iron ions present may be substantially oxidized from the divalent state to trivalent state that avoids the formation of unacceptable levels of lithium tri-niobate and further substantially minimizes the diffusion of lithium from the lithium niobate.

SUMMARY OF THE INVENTION

The present invention specifically addresses and alleviates the above-identified deficiencies in the art. More specifically, the present invention is directed to a process for oxidizing a portion of the divalent iron ions present in a crystal of iron-doped lithium niobate to trivalent state, and is particularly effective in achieving $[Fe^{2+}]/[Fe^{3+}]$ ratios which are less than or approximately equal to 0.01. The process of the present invention further allows for the divalent iron ions present in an iron-doped lithium niobate crystal to be oxidized while allowing the host crystal to retain its holographic recording properties (i.e., a minimum concentration of $Fe^{2+}$). In this regard, the process of the present invention prevents or otherwise substantially reduces the formation of lithium tri-niobate within and diffusion of lithium from the host crystal.

The process comprises the initial step of protonating the iron-doped lithium niobate. Such protonation may be achieved by exposing the crystal to steam at a temperature of approximately 600° C. As is known to those skilled in the art, the application of an electric field may further enhance the protonation of the iron-doped lithium niobate. The crystal is thereafter placed in a pressure chamber and emersed in an oxygen-containing atmosphere at a pressure preferably between 10 and 100 atmospheres. While in such environment, the crystal is then heated from room temperature (approximately 30° C.) to 950° C. at a rate not to exceed 25° C. per minute. The crystal is then maintained at the 950° C. temperature for approximately 50 hours and then is cooled to room temperature at a rate not to exceed 50° C. per minute, and preferably at approximately 25° C. per minute. The pressure chamber is then vented and the crystal removed. The crystal is then de-protonated by, for example, heating the crystal to between 160° C. and 240° C. and simultaneously applying an appropriate electric field.

It is therefore an object of the present invention to provide a process for oxidizing iron-doped lithium niobate such that the iron ions contained therein exist predominantly in the trivalent state, and preferably such that the concentration of divalent iron ions to trivalent iron ions is less than or approximately equal to 0.01.

Another object of the present invention is to provide a process for oxidizing iron-doped lithium niobate that effectively converts a substantial portion of the divalent iron ions present in the crystal to trivalent iron ions while minimizing the formation of lithium tri-niobate therein.

A still further object of the present invention is to provide a process for oxidizing iron-doped lithium niobate that effectively converts a substantial portion of the divalent iron ions present in the crystal to trivalent iron ions while minimizing the diffusion of lithium from the iron-doped lithium niobate, and thus minimizing the formation of light-absorbing color centers within said iron-doped lithium niobate.

BRIEF DESCRIPTION OF THE DRAWINGS

These, as well as other features of the present invention will become more apparent upon reference to the drawing wherein.

DETAILED DESCRIPTION OF THE PREFERRED EMBODIMENTS

Figure 1:
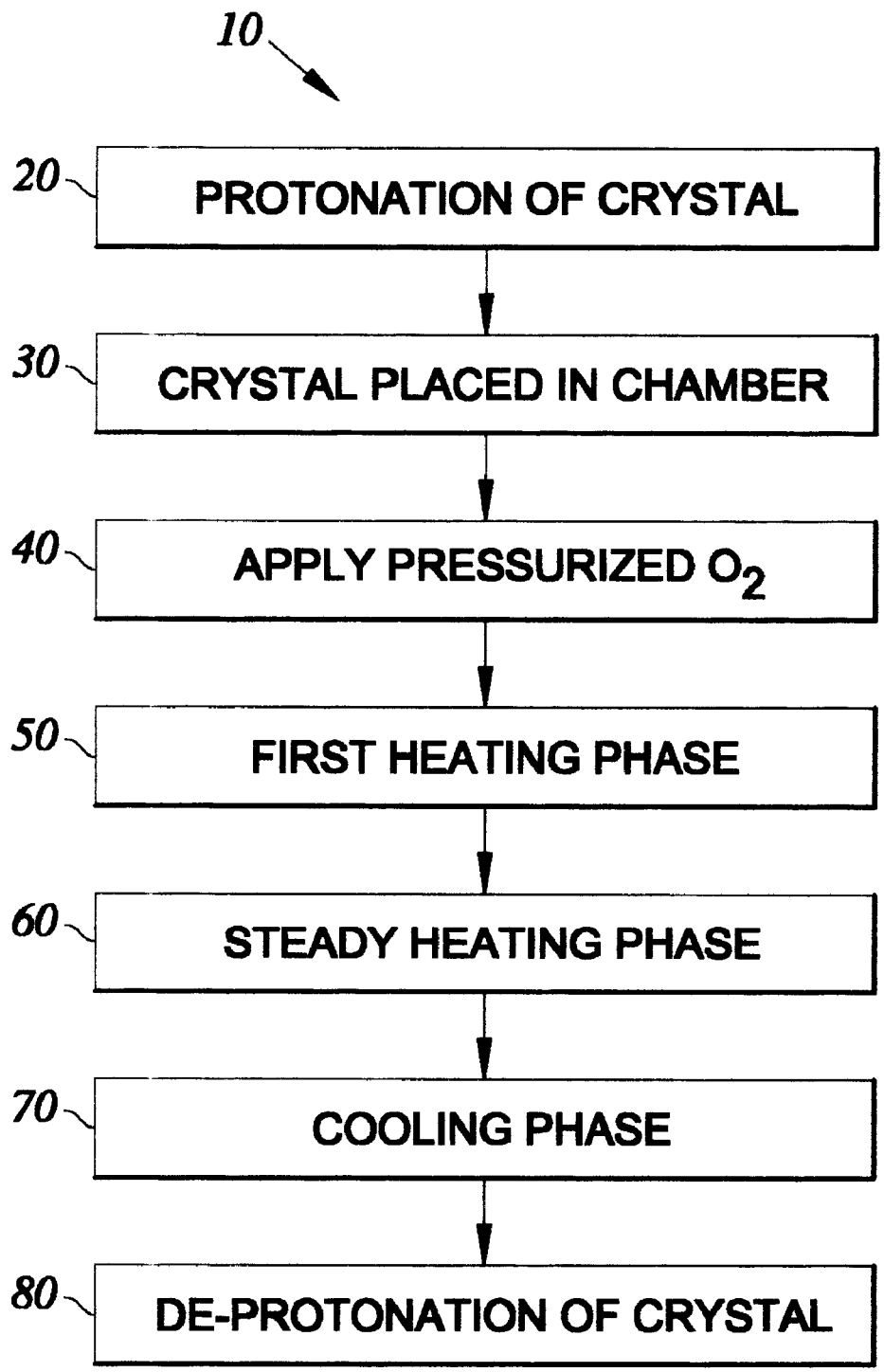
FIG. 1 is a schematic diagram of the steps utilized in the process for oxidizing iron-doped lithium niobate according to a preferred embodiment of the present invention.

Referring now to the drawing, and more particularly FIG. 1, there is shown schematically a process useful for oxidizing iron-doped lithium niobate. In this regard, lithium niobate is widely used for recording and reading holographic information. As is well known in the art, the sensitivity of such crystals, as well as the diffraction efficiency thereof, can be greatly improved by doping such crystals with iron. For example, iron-doped lithium niobate crystals are known to have 500 times the recording sensitivity and 10 times the diffraction efficiency of undoped crystals.

To enhance the ability of such crystals to store and read holographic data, it is advantageous to modify the respective concentrations of the iron ions embedded within such crystals existing in the divalent ($Fe^{2+}$) and trivalent ($Fe^{3+}$) state. In this respect, it is frequently advantageous to produce lithium niobate crystals wherein the ratio of trivalent iron ions to divalent iron ions is greater than 1:1, and more preferably is approximately 100:1. This higher concentration of trivalent iron ions enhances the ability of the crystal to store data and further, allows the stored data to be read more times than iron-doped lithium niobate crystals having lesser concentrations of trivalent iron ions.

The process of producing crystals containing such ratios of trivalent iron ions to divalent iron ions, however, has proven to be problematic. Generally, such procedures are not always effective in achieving the desired trivalent ion to divalent ion ratios. Specifically, prior art oxidizing agents, the most notable of which being oxygen, and other oxidizing techniques are generally ineffective at penetrating the lithium niobate crystal to oxidize the iron ions contained therein.

While prior art methods do exist that are effective in converting divalent iron ions to trivalent iron ions contained within iron-doped lithium niobate, such processes have deleterious effects that render the host crystal unusable for holographic applications. More specifically, such processes currently used in the art require that such crystals be heated at temperatures from 800° C. to 1000° C. for prolonged periods of time.

The practice of heating iron-doped lithium niobate at such temperatures is known to produce two (2) undesirable side effects. Firstly, iron-doped lithium niobate, when heated to such temperature, produces a second phase crystal, namely lithium tri-niobate ($LiNi_3O_8$). As is well-known to those skilled in the art, lithium tri-niobate has light scattering properties, and, when present in an amount to cause light scattering of approximately $10^{-7}$ steradians per centimeter, renders lithium niobate crystal unusable in holographic applications.

Secondly, when iron-doped lithium niobate is heated to temperatures of approximately 800° C. or higher, a portion of the lithium contained therein diffuses out of the crystal. This diffusion of lithium from lithium niobate crystals causes discoloration within such crystals. Such discoloration has light-absorbing properties which likewise render such crystals useless for holographic applications. This is particularly so in light of the fact that the discoloration produced by the diffusion of lithium from the crystal has a propensity to absorb light having a wavelength near 532 nanometers, the approximate wavelength of light utilized to record and store holographic data.

The processes described herein, in contrast, achieves such desired trivalent ion to divalent ion ratios without adversely affecting the ability of the lithium niobate crystals to function in holographic applications. The process of the present invention is particularly well-suited to oxidize large lithium niobate crystals having dimensions as large or larger than 1.0 cm. The process of the present invention is also particularly well-suited for lithium niobate crystals that are heavily iron-doped, wherein the crystals contain greater than or approximately equal to 0.1 mol percent of iron.

With regard to the process of the present invention, the initial step comprises protonating the iron-doped lithium niobate crystal 20. Thorough protonation of the crystal may preferably be achieved by subjecting such crystals to steam heated to 600° C. at 1 atmosphere of pressure. The application of an electric field during the steaming process may further facilitate the integration of protons into the crystal. As will be appreciated by those skilled in the art, the protonation of such crystal will enable the iron ions contained therein to be oxidized at lower temperatures than prior art methods while at the same time allowing the crystal to retain its desirable holographic recording properties.

Following protonation 20, the crystal is then placed within a pressure chamber 30. As will be recognized by those skilled in the art, it will be necessary to handle such lithium niobate crystals with latex gloves in order to maintain clean crystal surfaces. Additionally, it should be understood that such crystals should be placed on a quartz tray with quartz supports to thus allow the oxygen, applied in a later step 40, to penetrate all surfaces of the crystal.

There is then applied dry, ultra-pure pressurized oxygen into the chamber 40. Preferably, such oxygen will have a purity of approximately 99.9999%, and may be readily obtained from commercial sources. The oxygen is applied at a pressure preferably between 10–100 atmospheres. In this regard, larger crystals will necessarily require proportionately greater pressure of oxygen.

The crystal is then heated, in a first heating phase 50, from room temperature (approximately 30° C.) to 950° C. at a rate not to exceed 50° C. per minute. Preferably, such heating rate should occur at approximately 25° C. per minute. Such controlled rate of heating is necessary to prevent the formation of cracks within the crystal, as can occur if such crystals are heated too rapidly.

Once heated to approximately 950° C., the crystal is then maintained at such temperature (i.e., 950° C.) during a steady heating phase 60 for approximately 50 hours.

Thereafter, the crystals are then cooled in a cooling phase 70 from the 950° C. temperature to 30° C. at a rate not to exceed 50° C. per minute, and preferably more slowly than 25° C. per minute. As discussed above, such cooling rate is necessary to prevent the formation of cracks within the crystals. Furthermore, such controlled cooling rate prevents the undesirable formation of lithium tri-niobate, which can occur if such crystals are cooled too slowly.

Following the cooling phase 70, the crystals may then be removed from the pressure chamber and deprotonated by, for example, heating them to between 160° C. and 240° C. and simultaneously applying an appropriate electric field. Thereafter, the crystals may be utilized in conventional application. Such crystals are particularly useful in holographic information storage systems, and particularly useful in read/write memories where enhanced data storage and read out properties are desired. As discussed above, the iron-doped lithium niobate crystals produced by the process of the present invention will have significantly enhanced trivalent to divalent iron ion ratios of up to approximately 100:1. The trivalent iron content of such crystals produced by the process of the present invention can be determined by comparing its optical absorption with an optical absorption curve calibrated from a series of crystals of known divalent or trivalent iron content determined by measuring the change in electron paramagnetic resonance (EPR) signal.

While it should be recognized that iron-doped lithium niobate used in holographic applications preferably has as many iron ions as possible that exist in the trivalent state, the present invention is further useful in achieving trivalent to divalent iron ion ratios less than 1:100, but in no case less than or equal to 1:1. As will be recognized by those skilled in the art, such sub-optimal oxidation of the divalent iron ions may be achieved by reducing the pressure of $O_2$ applied in step 40 and/or reducing the time such iron-doped lithium niobate crystals are heated during the steady heating phase.

There is thus then provided a process for oxidizing a portion of the divalent iron ions present in an iron-doped lithium niobate crystal such that the holographic storage and read out properties of such crystal are greatly enhanced. It should be recognized, however, that modifications of the present invention may be made by those skilled in the art and that the claims of the present invention be construed as broadly as possible, in light of the specification if need be.

What is claimed is:

1. A method for enhancing a holographic data storage capacity of a lithium niobate crystal doped with divalent and trivalent iron ions comprising the steps of:
   a) protonating said crystal;
   b) surrounding said crystal in a pressurized oxygen-containing atmosphere;
   c) controllably heating said crystal to a temperature sufficient to cause at least half of all iron ions present in said crystal to exist as trivalent iron ions;
   d) de-protonating said crystal.

2. The method of claim 1 wherein in step c), said crystal is controllably heated to a temperature sufficient to cause at least 95% of all iron ions present in said crystal to exist as trivalent iron ions.

3. The method of claim 1 wherein in step c), said crystal is controllably heated to a temperature sufficient to cause at least 99% of all iron ions present in said crystal to exist as trivalent iron ions.

4. The method of claim 1 wherein step c) further comprises controllably heating said crystal such that lithium tri-niobate forms within said crystal to a concentration insufficient to cause unacceptable light scattering levels.

5. The method of claim 4 wherein in step c), said crystal is controllably heated to a temperature such that said lithium tri-niobate does not form to a concentration sufficient to cause light scattering greater than $10^{-7}$ steradians per centimeter.

6. The method of claim 1 wherein in step a), said protonation comprises contacting said crystal with steam having a temperature no greater than approximately 600° C., said steam having a pressure of no greater than 1 atmosphere.

7. The method of claim 6 wherein in step a), said protonation further comprises applying an electric field to said crystal when said crystal is contacted with said steam.

8. The method of claim 1 wherein in step b), said oxygen-containing atmosphere is applied at a pressure no greater than 100 atmospheres.

9. The method of claim 1 wherein in step b), said oxygen-containing atmosphere is applied at a pressure between 10–100 atmospheres.

10. The method of claim 1 wherein in step c), said crystal is heated to a temperature of at least approximately 950° C.

11. The method of claim 10 wherein step c) further comprises heating said crystal from approximately 30° C. to said 950° C. at a rate less than 50° C. per minute.

12. The method of claim 10 wherein step c) further comprises heating said crystal from approximately 30° C. to said 950° C. at a rate not less than 25° C. per minute.

13. The method of claim 1 wherein in step c), once at least half of all iron ions are caused to exist as trivalent iron ions, said crystal is controllably cooled to approximately 30° C.

14. The method of claim 13 wherein in step e), said de-protonation comprises heating the crystal to between 160° C. and 240° C., while simultaneously applying an electric field to said crystal.

15. The method of claim 13 wherein in step d), said crystal is cooled from said temperature in step c) to 30° C. at a rate less than 50° C. per minute.

16. The method of claim 15 wherein in step d), said crystal is cooled from said temperature in step c) to 30° C. at a rate not less than 25° C. per minute.

17. The method of claim 15 wherein in step d), said crystal is cooled from said temperature in step c) to 30° C. at a rate not less than 12° C per minute.

18. A method for enhancing a ratio of trivalent iron ions to divalent iron ions present in a crystal of iron-doped lithium niobate useful for recording and reading holographic date comprising the steps of:
   a) protonating said crystal;
   b) contacting said crystal with a pressurized, oxygen-containing atmosphere;
   c) controllably heating said crystal to a temperature sufficient to cause at least half of all iron ions present to exist in the trivalent state;
   d) de-protonating said crystal.

19. The method as recited in claim 18 wherein in step c), said heating is further controlled such that formation of lithium tri-niobate within said crystal is prevented from reaching a concentration sufficient to cause unacceptable light scattering levels within said crystal when said crystal is subjected to light for purposes of recording and storing holographic data.

20. The method as recited in claim 19 wherein in step c), said heating is so controlled such that said formation of lithium tri-niobate is insufficient to reach a concentration that produces a level of light scattering greater than $10^{-7}$ steradians per centimeter.

21. A method for enhancing a holographic data storage capacity of a lithium niobate crystal doped with divalent and trivalent iron ions by increasing the number of trivalent iron ions relative divalent iron ions comprising the steps of:
   a) protonating said crystal;
   b) surrounding said crystal in a pressurized, oxygen-containing atmosphere;
   c) controllably heating said crystal to a temperature sufficient to cause at least half of all iron ions present in said crystal to exist as trivalent iron ions; and
   d) controllably cooling said crystal from the temperature in step c) to approximately 30° C.

* * * * *